(12) United States Patent
Watanabe

(10) Patent No.: US 10,514,416 B2
(45) Date of Patent: Dec. 24, 2019

(54) ELECTRONIC COMPONENT HANDLING APPARATUS AND ELECTRONIC COMPONENT TESTING APPARATUS

(71) Applicant: Advantest Corporation, Tokyo (JP)

(72) Inventor: Katsuhiko Watanabe, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 238 days.

(21) Appl. No.: 15/719,849

(22) Filed: Sep. 29, 2017

(65) Prior Publication Data

US 2019/0101587 A1 Apr. 4, 2019

(51) Int. Cl.
*G01R 31/28* (2006.01)
*G01R 11/185* (2006.01)

(52) U.S. Cl.
CPC ........ *G01R 31/2874* (2013.01); *G01R 11/185* (2013.01)

(58) Field of Classification Search
CPC .............. G01R 1/0466; G01R 31/043; G01R 31/2868; G01R 31/2874; G01R 31/2893
See application file for complete search history.

(56) References Cited

U.S. PATENT DOCUMENTS

| | | | |
|---|---|---|---|
| 6,389,225 B1 | 5/2002 | Malinoski et al. | |
| 6,476,627 B1 | 11/2002 | Pelissier et al. | |
| 6,549,026 B1 | 4/2003 | DiBattista et al. | |
| 6,593,761 B1* | 7/2003 | Fukasawa | G01R 31/2868 324/750.13 |
| 7,023,229 B2* | 4/2006 | Maesaki | G01R 31/2862 324/750.07 |
| 2002/0033391 A1 | 3/2002 | Malinoski et al. | |
| 2002/0050833 A1 | 5/2002 | Jones et al. | |
| 2002/0121913 A1* | 9/2002 | Miller | G01R 31/2874 324/750.05 |
| 2002/0186031 A1 | 12/2002 | Pelissier | |
| 2003/0001605 A1 | 1/2003 | Jones et al. | |
| 2003/0047305 A1 | 3/2003 | Malinoski et al. | |
| 2004/0071189 A1 | 4/2004 | Tanaka | |
| 2011/0126931 A1 | 6/2011 | Ide et al. | |

FOREIGN PATENT DOCUMENTS

| | | |
|---|---|---|
| JP | 2002-520630 A | 7/2002 |
| JP | 2004-134472 A | 4/2004 |
| JP | 2006-125865 A | 5/2006 |
| WO | 2008/026392 A1 | 3/2008 |

* cited by examiner

*Primary Examiner* — Tung X Nguyen
(74) *Attorney, Agent, or Firm* — Osha Liang LLP

(57) ABSTRACT

An electronic component handling apparatus that handles a DUT having a temperature detection circuit and presses the DUT against a socket electrically connected to a tester is provided. The electronic component includes: a temperature adjuster that adjusts a temperature of the DUT; a first receiver that receives a first signal from the tester, the first signal indicating a junction temperature of the DUT; a second receiver that receives a second signal from the tester, the second signal indicating a detection value of the temperature detection circuit; a first calculator that calculates the temperature of the DUT by using the first signal and the second signal; and a temperature controller that controls the temperature adjuster on the basis of a calculation result of the first calculator.

8 Claims, 3 Drawing Sheets

92···TEMPERATURE DETECTION CIRCUIT

ELECTRONIC COMPONENT HANDLING APPARATUS AND ELECTRONIC COMPONENT TESTING APPARATUS

TECHNICAL FIELD

The present invention relates to an electronic component handling apparatus used for testing of an electronic device under test (hereinafter, referred to as a "device under test (DUT)") such as a semiconductor integrated circuit device, and an electronic component testing apparatus including the same.

The entire contents of U.S. patent application Ser. No. 12/742,178 filed on May 27, 2009 in the USPTO are incorporated by reference into the specification and/or drawings of the present application and considered to be a portion of the description of the specification and/or drawings.

BACKGROUND ART

There is known a technique of integrating a temperature detection circuit in a semiconductor device itself, monitoring a temperature of a circuit to be evaluated with an LSI tester, and testing the semiconductor device when a monitor temperature converges to a desired set temperature (refer to, for example, Patent Document 1).

CITATION LIST

Patent Document

Japanese Patent Document 1: JP 2006-125865 A

SUMMARY OF THE INVENTION

Problem to be Solved by the Invention

In a case where the LSI tester calculates the monitor temperature on the basis of the detection signal of the temperature detection circuit, since the tester also needs to execute the test of the semiconductor device, it is possible to calculate the monitor temperature only in the intervals between the tests. For this reason, for example, in a case where a type of semiconductor device which self-heats rapidly in a short time is a test object, there is a problem in that, in some cases, the temperature of the semiconductor device cannot be grasped in spite of the fact that the temperature of the semiconductor device has greatly changed during the test, and the test quality is deteriorated.

Problems to be solved by the present invention include providing an electronic component handling apparatus capable of improving test quality and an electronic component testing apparatus including the same.

Means for Solving Problem

[1] The electronic component handling apparatus according to the present invention is an electronic component handling apparatus handling a DUT having a temperature detection circuit and pressing the DUT against a socket electrically connected to a tester, comprising: a temperature adjuster adjusting a temperature of the DUT; a first receiver receiving a first signal from the tester, the first signal indicating a junction temperature of the DUT; a second receiver receiving a second signal from the tester, the second signal indicating a detection value of the temperature detection circuit; a first calculator calculating the temperature of the DUT by using the first signal and the second signal; and a temperature controller controlling the temperature adjuster on the basis of a calculation result of the first calculator.

[2] In the above invention, the second signal may be an analog signal outputted from the tester, and the electronic component handling apparatus may comprise a converter performing AD conversion on the second signal received by the second receiver and outputting the converted signal to the first calculator.

[3] In the above invention, a second period during which the second signal is transmitted from the tester may be longer than a first period during which the first signal is transmitted from the tester.

[4] The electronic component testing apparatus according to the present invention is an electronic component testing apparatus testing a DUT having a temperature detection circuit, comprising: the above electronic component handling apparatus; and a tester electrically connected to the socket and testing the DUT, wherein the tester includes: a second calculator calculating a junction temperature from a detection value of the temperature detection circuit; a first transmitter outputting a calculation result of the second calculator as the first signal to the first receiver; and a second transmitter outputting the detection value of the temperature detection circuit as the second signal to the second receiver.

[5] In the above invention, the first signal may be a digital signal outputted from the tester, and the second calculator may calculate the junction temperature from the detection value of the temperature detection circuit and perform AD conversion to generate the first signal.

[6] In the above invention, the tester may comprise a switch switching a connection destination of the temperature detection circuit to the second calculator or the second transmitter.

[7] In the above invention, the first calculator may calculate the temperature of the DUT by correcting the first signal by using the second signal.

[8] In the above aspect of the invention, the first calculator may calculate the temperature of the DUT by correcting the second signal by using the first signal.

Effect of the Invention

According to the invention, a temperature of a DUT is calculated by using a first signal indicating a junction temperature of the DUT and a second signal indicating a detection value of a temperature detection circuit. For this reason, even during the test of the DUT, it is possible to grasp the temperature of the DUT, and it is possible to improve the test quality.

MODE(S) FOR CARRYING OUT THE INVENTION

Hereinafter, embodiments of the invention will be described with reference to the drawings.

Figure 1:
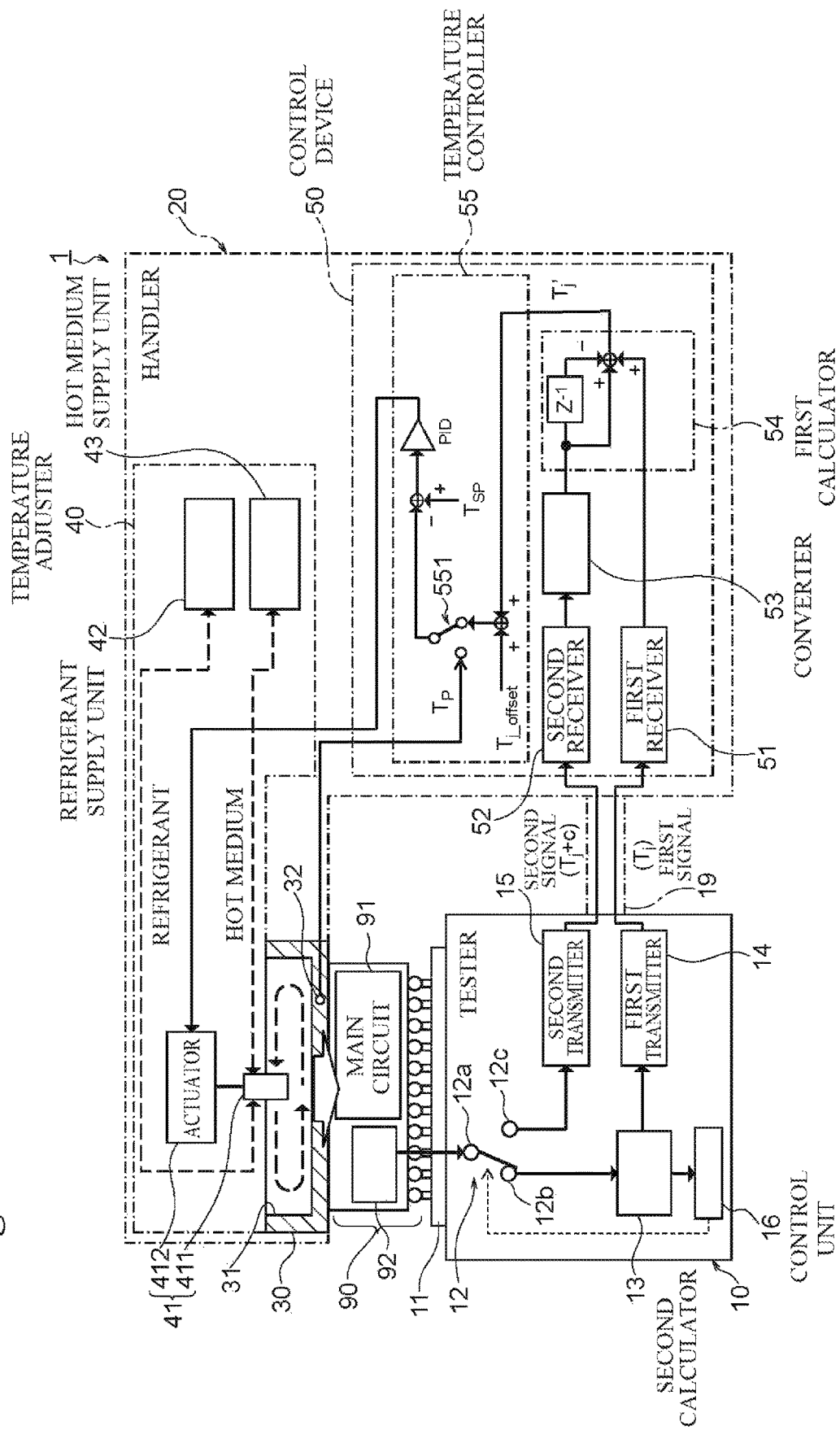
FIG. 1 is a block diagram illustrating a configuration of an electronic component testing apparatus in an embodiment of the invention.
Figure 2:
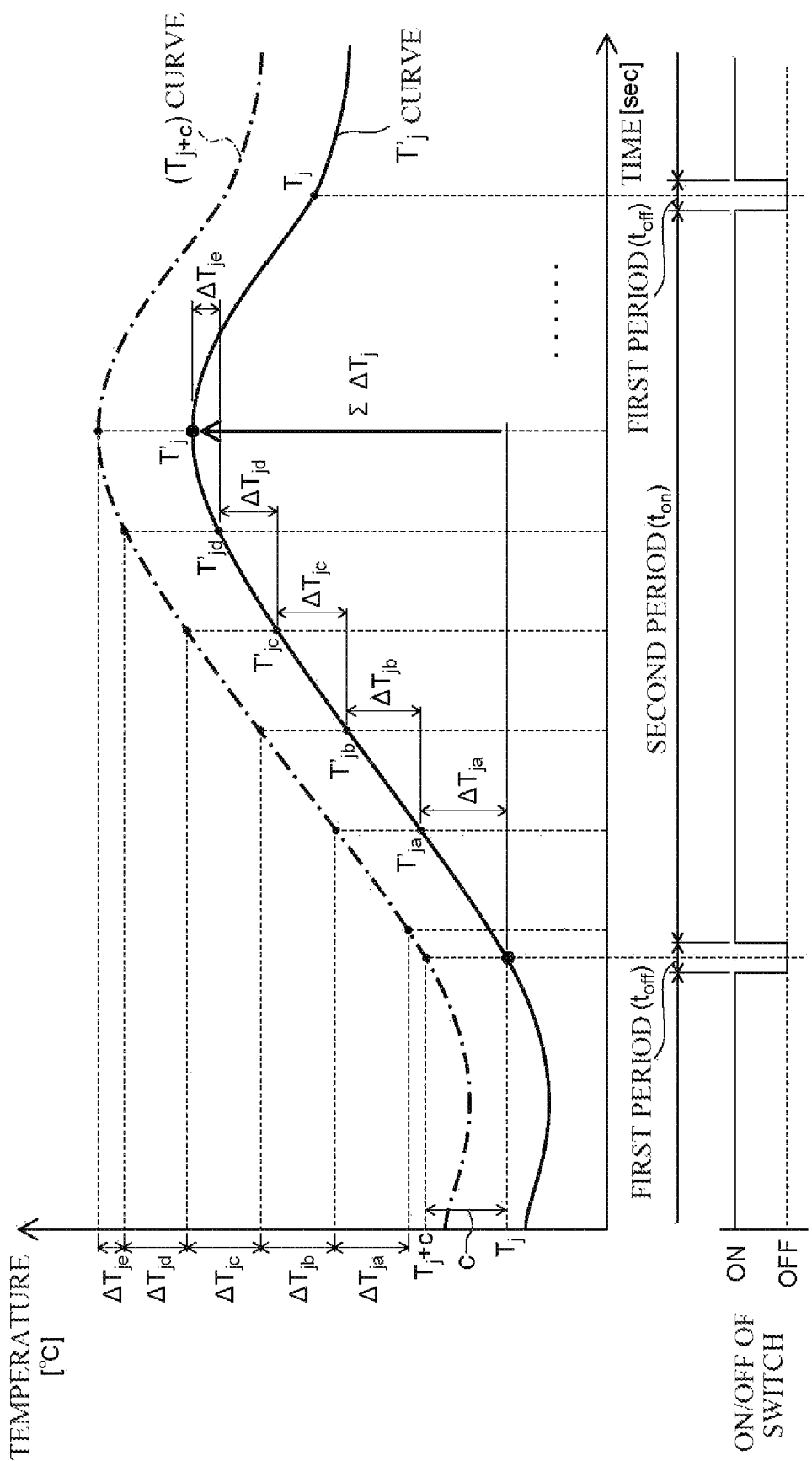
FIG. 2 is a diagram illustrating a method of calculating a DUT temperature $T_j'$ in an embodiment of the invention.

FIG. 1 is a block diagram illustrating an electronic component testing apparatus in the embodiment, and FIG. 2 is a diagram illustrating a method of calculating a DUT temperature $T_j'$ in the embodiment.

The electronic component testing apparatus 1 in the embodiment is an apparatus for testing electrical characteristics of a DUT 90 such as a semiconductor integrated circuit device. As illustrated in FIG. 1, the DUT 90 in the embodiment includes a temperature detection circuit 92 for detecting a temperature of the DUT 90 in addition to a main circuit 91 to be tested by a tester 10.

The temperature detection circuit 92 in the embodiment is, for example, a circuit including a thermal diode, and is formed on a semiconductor substrate on which the main circuit 91 is formed. The temperature detection circuit 92 detects the temperature of the DUT 90 by utilizing temperature dependency of a PN junction. The configuration of the temperature detection circuit 92 is not particularly limited to the above-described configuration. For example, the temperature detection circuit 92 may be configured by using an element having resistance characteristics or band gap characteristics which are dependent on temperature. Alternatively, as the temperature detection circuit 92, a thermocouple may be buried in the DUT 90.

As illustrated in FIG. 1, the electronic component testing apparatus 1 in the embodiment is configured to include a tester 10 and a handler 20.

The tester 10 has a socket 11 to which the DUT 90 is electrically connected. The tester 10 executes a test of the DUT 90 by inputting/outputting a test signal to/from the main circuit 91 of the DUT 90 through the socket 11. In addition, a detection voltage signal of the temperature detection circuit 92 of the DUT 90 is taken into the tester 10 through the socket 11.

The handler 20 is configured to supply the DUT 90 before the test to the socket 11 so as to press the DUT 90, and the handler 20 is configured to classify the DUT 90 according to the test result. The tester 10 and the handler 20 are connected to each other through a cable 19, and thus, signals and data can be exchanged between the tester 10 and the handler 20.

As illustrated in FIG. 1, the tester 10 in the embodiment is configured to include a switch 12, a second calculator 13, a first transmitter 14, and a second transmitter 15. An input terminal 12a of the switch 12 is electrically connected to the socket 11. One output terminal 12b of the switch 12 is electrically connected to the second calculator 13. On the other hand, the other output terminal 12c of the switch 12 is electrically connected to the second transmitter 15. The switch 12 selectively switches the output destination to the second calculator 13 or the second transmitter 15 according to a command from the control unit 16 of the tester 10. As an example of the control unit 16 of the tester 10, a workstation can be exemplified.

The detection voltage signal of the temperature detection circuit 92 is inputted to each of the second calculator 13 and the second transmitter 15 through the socket 11 and the switch 12. The detection voltage signal of the temperature detection circuit 92 is an analog signal.

The second calculator 13 has an AD conversion function for converting the detection voltage signal into a digital signal and also has an calculation function for obtaining the junction temperature $T_j$ by performing a predetermined correction process on the detection voltage signal so as to generate a first signal indicating the junction temperature $T_j$. The junction temperature $T_j$ is the temperature of the semiconductor substrate in the DUT 90 and is outputted to the control unit 16 that executes the test of the DUT 90.

In the embodiment, in addition to the control unit 16, the first transmitter 14 is connected to the output side of the second calculator 13. The first transmitter 14 transmits the first signal generated by the second calculator 13 to the first receiver 51 of the handler 20. This first signal is a digital signal and is transmitted via, for example, I2C (inter-integrated circuit) bus, but not particularly limited thereto.

On the other hand, the second transmitter 15 transmits the detection voltage signal of the temperature detection circuit 92 as the second signal to the second receiver 52 of the handler 20 in the state where the detection voltage signal is an analog signal.

The junction temperature $T_j$ indicated by the first signal is the temperature of the DUT 90 calculated with high accuracy by the second calculator 13. On the other hand, the detection temperature ($T_j$+c) indicated by the second signal is not subjected to calculation such as correction and is the output itself of the temperature detection circuit 92. Since there are differences in the presence or absence of such a correction process and in the distance of a signal path, the detection temperature indicated by the second signal contains an error c with respect to the junction temperature $T_j$ (refer to FIG. 2).

As illustrated in FIG. 1, the handler 20 in the embodiment is configured to include a pusher 30, a temperature adjuster 40, and a control device 50. The pusher 30 presses the DUT 90 against the socket 11 so as to electrically connect the DUT 90 and the socket 11 for executing the test of the DUT 90. The temperature adjuster 40 adjusts the temperature of the DUT 90 by using a refrigerant and a hot medium in the state where the pusher 30 is in contact with the DUT 90. The control device 50 calculates the temperature $T_j'$ of the DUT 90 by using the first and second signals transmitted from the tester 10 and controls the temperature adjuster 40 on the basis of the calculated temperature.

The pusher 30 is a member that comes into contact with the DUT 90 when the handler 20 presses the DUT 90 against the socket 11. Therefore, the pusher 30 has an internal space 31 to which the refrigerant and the hot medium are supplied from the temperature adjuster 40. In addition, a temperature sensor 32 is buried in the pusher 30. The detection signal of the temperature sensor 32 is configured so as to be outputted to the temperature controller 55.

The temperature adjuster 40 is configured to include a flow rate adjustment unit 41, a refrigerant supply unit 42, and a hot medium supply unit 43. The internal space 31 of the pusher 30 communicates with the refrigerant supply unit 42 and the hot medium supply unit 43 through the flow rate adjustment unit 41. Although not particularly illustrated, the refrigerant supply unit 42 has, for example, a circulation path for supplying the liquid refrigerant to the internal space 31 of the pusher 30 and retrieving the refrigerant from the internal space 31 and has a pump, a chiller, and the like provided on the circulation path. Similarly, although not particularly illustrated, the hot medium supply unit 43 also has, for example, a circulation path for supplying the liquid hot medium to the internal space 31 of the pusher 30 and retrieving the hot medium from the internal space 31 and has a pump, a chiller, and the like provided on the circulation path.

By opening and closing a valve 411, the flow rate adjustment unit 41 can arbitrarily adjust the flow rate of the refrigerant supplied from the refrigerant supply unit 42 to the internal space 31 of the pusher 30 and the flow rate of the hot medium supplied from the hot medium supply unit 43 to the internal space 31 of the pusher 30. The valve 411 is connected to an actuator 412 such as a motor, and the valve 41 is operated to be opened and closed by rotating the valve 411 by the actuator 412. Then, in the state where the pusher 30 is in contact with the DUT 90, the control device 50 drives the actuator 412 to adjust the flow rates of the refrigerant and the hot medium, respectively, so that the temperature of the DUT 90 can be adjusted.

As a specific example of the temperature adjuster 40, for example, an apparatus described in U.S. patent application Ser. No. 12/742,178 (US patent application publication No. 2011/0,126,931 A) can be exemplified. The configuration of the temperature adjuster is not particularly limited to the above-described configuration. For example, instead of the valve 411 and the actuator 412, the flow rates of the refrigerant and the hot medium may be adjusted by using solenoid valves, respectively. Alternatively, a thermostreamer, a heater, or the like using a gas as a refrigerant and a hot medium may be used as a temperature adjuster.

As illustrated in FIG. 1, the control device 50 is configured to include a first receiver 51, a second receiver 52, a converter 53, a first calculator 54, and a temperature controller 55.

The first receiver 51 receives the first signal from the first transmitter 14 of the tester 10 and outputs the first signal to the first calculator 54. On the other hand, the second receiver 52 receives the second signal from the second transmitter 15 of the tester 10, and the converter 53 performs AD conversion on the second signal and outputs the converted digital signal to the first calculator 54. The second calculator 13 of the tester 10 has a calculation function in addition to the AD conversion function, whereas the converter 53 of the handler 20 has only the function of converting the second signal into a digital signal.

The first calculator 54 calculates the current temperature $T_j'$ (hereinafter, simply referred to as a "DUT temperature $T_j'$") of the DUT 90 by using the first signal (junction temperature $T_j$) inputted from the first receiver 51 and the second signal (detection temperature $T_j+c$) inputted from the converter 53 in accordance with Mathematical Formula (1) (refer to FIG. 2).

[Mathematical Formula 1]

$$\left. \begin{array}{l} T_j' = T_j + \sum \Delta T_j \\ \Delta T_j = (T_j + c) - z^{-1}(T_j + c) \end{array} \right\} \quad (1)$$

In Mathematical Formula (1), $T_j$ represents the junction temperature immediately before turning on the switch 12, $(T_j+c)$ represents the latest sampled detection temperature, $z^{-1}(T_j+c)$ represents the one-time preceding sampled detection temperature, and $\Sigma \Delta T_j$ represents a sum of $\Delta T_j$ calculated from the detection temperature sampled from the first time to the latest time.

The temperature controller 55 controls the actuator 412 of the flow rate adjustment unit 41 of the temperature adjuster 40 so that the difference between the DUT temperature $T_j'$ calculated by the first calculator 54 and a set point $T_{SP}$ as a target temperature is minimized. As a specific control method executed by the temperature controller 55, for example, PID (Proportional-Integral-Differential) control can be exemplified.

As illustrated in FIG. 1, the temperature controller 55 may be configured so that an arbitrary offset value $T_{j\_offset}$ can be added to the DUT temperature $T_j'$ calculated by the first calculator 54. As a result, the DUT temperature $T_j'$ can be finely adjusted.

Instead of the DUT temperature $T_j'$ calculated by the first calculator 54, in order to perform PID control using a detection result $T_P$ of the temperature sensor 32 of the pusher 30, the temperature controller 55 may include a switch 551.

Hereinafter, the operations of the electronic component testing apparatus in the embodiment will be described.

When the DUT 90 is mounted on the socket 11 by the handler 20, the pusher 30 presses the DUT 90 against the socket 11, so that the DUT 90 and the socket 11 are electrically connected to each other. Then, the tester 10 executes the test of the DUT 90.

The control unit 16 of the tester 10 switches the switch 12 so that the socket 11 is connected to the second calculator 13 while the test of the DUT 90 is not being executed (that is, in the interval between the tests). As a result, the detection voltage signal of the temperature detection circuit 92 is inputted to the second calculator 13.

On the other hand, while the test of the DUT 90 is being executed, the control unit 16 of the tester 10 switches the switch 12 so that the socket 11 is connected to the second transmitter 15. As a result, the detection voltage signal of the temperature detection circuit 92 is inputted to the second transmitter 15.

The test time of the DUT 90 is longer than the interval time between the tests. For this reason, as illustrated in FIG. 2, the time $t_{on}$ during which the switch 12 is turned on (that is, the time during which the second signal $(T_j+c)$ is transmitted from the tester 10) is longer than the time $t_{off}$ during which the switch 12 is turned off (that is, the time during which the first signal $T_j$ is transmitted from the tester 10).

The time $t_{off}$ in the embodiment corresponds to an example of the first period in the present invention, and the time $t_{on}$ in the embodiment corresponds to an example of the second period in the present invention.

Returning to FIG. 1, the second calculator 13 performs AD conversion on the detection voltage signal input through the socket 11 and the switch 12 into a digital signal and performs a predetermined correction process on the detection voltage signal to generate a first signal (junction temperature $T_j$). The first signal is inputted to the first calculator 54 through the first transmitter 14 and the first receiver 51.

On the other hand, the detection voltage signal inputted to the second transmitter 15 through the socket 11 and the switch 12 is inputted to the converter 53 through the second transmitter 15 and the second receiver 52 in the state where the detection voltage signal is an analog signal. The converter 53 performs AD conversion on the second signal and outputs the converted digital signal to the first calculator 54.

Every time the second signal $(T_j+c)$ is inputted from the converter 53, the first calculator 54 calculates the current DUT temperature $T_j'$ in accordance with the above-described Mathematical Formula (1). In the embodiment, the first signal (junction temperature $T_j$) is successively corrected by using the second signal $(T_j+c)$ in accordance with the above-described Mathematical Formula (1).

Herein, as described above, since the test time of the DUT is longer than the interval time between the tests, for example, in a case where the DUT is a self-heating type such as a graphics processing unit (GPU) or the like, in some cases, the DUT temperature may not be grasped in spite of a large change in the temperature of the DUT during the test.

On the other hand, in the embodiment, as illustrated in FIG. 2, a cumulative error $(\Sigma \Delta T_j)$ obtained from a time series of the second signals $(T_j+c)$ is added to the first signal (junction temperature $T_j$), and the DUT temperature $T_j'$ is calculated on the basis of the first signal. As a result, as illustrated by the solid line in FIG. 2, the temperature $T_j'$ of the DUT 90 can be grasped with high accuracy almost in real time.

Every time the first signal is inputted from the second calculator 13 (namely, every time the junction temperature $T_j$ is calculated by the first calculator 13), the first calculator 54 sets the junction temperature $T_j$ in the above-described Mathematical Formula (1) again and initializes the cumulative error ($\tau\Delta T_j$), and after that, calculates Mathematical Formula (1).

Figure 3:
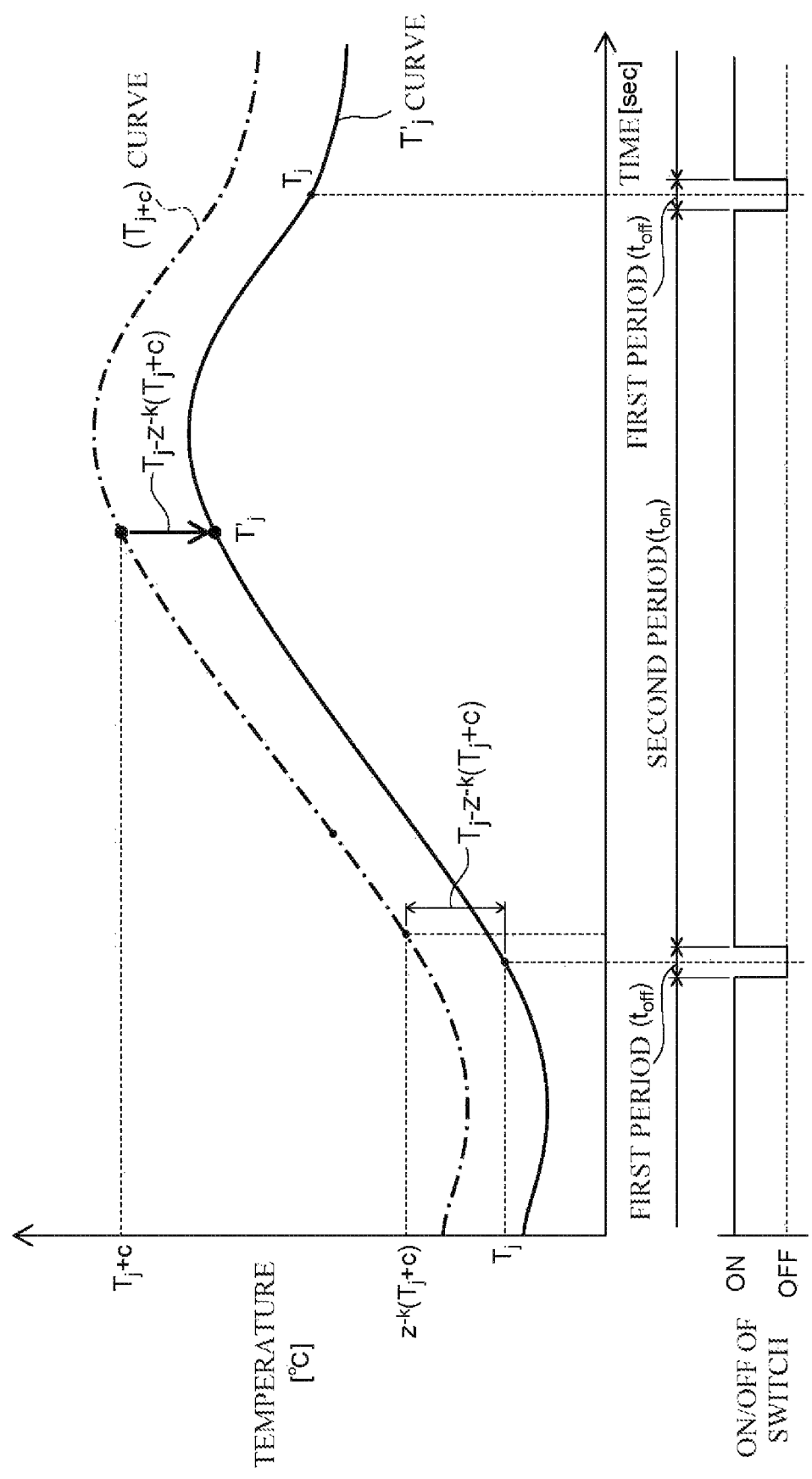
FIG. 3 is a diagram illustrating a modified example of the method of calculating the DUT temperature $T_j'$ in the embodiment of the invention.

FIG. 3 is a diagram illustrating a modified example of the method of calculating the DUT temperature $T_j'$ in the embodiment.

Instead of Mathematical Formula (1), the first calculator 54 may calculate the DUT temperature $T_j'$ in accordance with the following Mathematical Formula (2). In the embodiment, the second signal ($T_j+c$) is successively corrected by using the first signal (junction temperature $T_j$) in accordance with the following Mathematical Formula (2).

[Mathematical Formula 2]

$$T_j'=(T_j+c)+\{T_j-z^{-k}(T_j+c)\} \quad (2)$$

In Mathematical Formula (2), ($T_j+c$) represents the latest sampled detection temperature, $T_j$ represents the junction temperature immediately before turning on the switch 12, $z^{-k}(T_j+c)$ represents the detection temperature sampled immediately after turning on the switch 12.

In the case of this example, as illustrated in FIG. 3, by calculating a difference between the first signal (junction temperature $T_j$) immediately before turning on the switch 12 and the second signal ($z^{-k}(T_j+c)$) immediately after turning on the switch 12 and by adding the difference to the latest second signal ($T_j+c$), the DUT temperature $T_j'$ is calculated on the basis of the second signal as a reference. Therefore, as indicated by the solid line in FIG. 3, the temperature $T_j'$ of the DUT 90 can be grasped with high accuracy almost in real time.

As described above, in the embodiment, by using the first signal indicating the junction temperature $T_j$ of the DUT 90 and the second signal ($T_j+c$) indicating the detection value of the temperature detection circuit, the current temperature $T_j'$ of the DUT 90 is calculated. Therefore, even during the test, it is possible to grasp the temperature of the DUT 90, and it is possible to improve the test quality.

Embodiments heretofore explained are described to facilitate understanding of the present invention and are not described to limit the present invention. It is therefore intended that the elements disclosed in the above embodiments include all design changes and equivalents to fall within the technical scope of the present invention.

For example, GPIB (General Purpose Interface Bus) connecting the workstation of the tester 10 and an FAPC of the handler 20 may be used for transmission of the first signal (junction temperature $T_j$) which is a digital signal.

EXPLANATIONS OF LETTERS OR NUMERALS

1: electronic component testing apparatus
10: tester
11: socket
12: switch
12a: input terminal
12b, 12c: output terminal
13: second calculator
14: first transmitter
15: second transmitter
16: control unit
19: cable
20: handler
30: pusher
31: internal space
32: temperature sensor
40: temperature adjuster
41: flow rate adjustment unit
411: valve
412: actuator
42: refrigerant supply unit
43: hot medium supply unit
50: control device
51: first receiver
52: second receiver
53: converter
54: first calculator
55: temperature controller
551: switch
90: DUT
91: main circuit
92: temperature detection circuit

The invention claimed is:

1. An electronic component handling apparatus that handles a DUT having a temperature detection circuit and presses the DUT against a socket electrically connected to a tester, comprising:
   a temperature adjuster that adjusts a temperature of the DUT;
   a first receiver that receives a first signal from the tester, the first signal indicating a junction temperature of the DUT;
   a second receiver that receives a second signal from the tester, the second signal indicating a detection value of the temperature detection circuit;
   a first calculator that calculates the temperature of the DUT by using the first signal and the second signal; and
   a temperature controller that controls the temperature adjuster on the basis of a calculation result of the first calculator.

2. The electronic component handling apparatus according to claim 1, wherein
   the second signal is an analog signal outputted from the tester, and
   the electronic component handling apparatus comprises a converter performing AD conversion on the second signal received by the second receiver and outputting the converted signal to the first calculator.

3. The electronic component handling apparatus according to claim 1, wherein
   a second period during which the second signal is transmitted from the tester is longer than a first period during which the first signal is transmitted from the tester.

4. An electronic component testing apparatus that tests a DUT having a temperature detection circuit, comprising:
   the electronic component handling apparatus according to claim 1; and
   a tester electrically connected to the socket and testing the DUT, wherein
   the tester includes:
      a second calculator that calculates a junction temperature from a detection value of the temperature detection circuit;
      a first transmitter that outputs a calculation result of the second calculator as the first signal to the first receiver; and a second transmitter that outputs the detection value of the temperature detection circuit as the second signal to the second receiver.

5. The electronic component testing apparatus according to claim 4, wherein the first signal is a digital signal outputted from the tester, and the second calculator calculates the junction temperature from the detection value of the temperature detection circuit and performs AD conversion to generate the first signal.

6. The electronic component testing apparatus according to claim 4, wherein the tester comprises a switch switching a connection destination of the temperature detection circuit to the second calculator or the second transmitter.

7. The electronic component testing apparatus according to claim 4, wherein the first calculator calculates the temperature of the DUT by correcting the first signal by using the second signal.

8. The electronic component testing apparatus according to claim 4, wherein the first calculator calculates the temperature of the DUT by correcting the second signal by using the first signal.

* * * * *